United States Patent [19]
Takehara et al.

[11] Patent Number: 6,093,885
[45] Date of Patent: Jul. 25, 2000

[54] PHOTOVOLTAIC POWER GENERATING SYSTEM

[75] Inventors: Nobuyoshi Takehara; Naoki Manabe, both of Kyoto, Japan

[73] Assignee: Canon Kabushiki Kaisha, Tokyo, Japan

[21] Appl. No.: 09/258,210

[22] Filed: Feb. 26, 1999

[30] Foreign Application Priority Data

Mar. 3, 1998 [JP] Japan ................... 10-066087

[51] Int. Cl.⁷ ........................ H01L 31/024; H01L 31/042
[52] U.S. Cl. ........................ 136/244; 136/291; 136/293; 323/906
[58] Field of Search .................. 136/244, 291, 136/293; 323/906

[56] References Cited

U.S. PATENT DOCUMENTS

| | | | |
|---|---|---|---|
| 4,697,136 | 9/1987 | Ishikawa | 323/267 |
| 5,669,987 | 9/1997 | Takehara et al. | 136/244 |
| 5,677,833 | 10/1997 | Bingley | 363/71 |
| 5,684,385 | 11/1997 | Guyonneau et al. | 320/15 |
| 5,853,497 | 12/1998 | Lillington et al. | 136/249 |
| 5,878,584 | 3/1999 | Sasaki et al. | 62/115 |

FOREIGN PATENT DOCUMENTS

| | | | |
|---|---|---|---|
| 8-250756 | 9/1996 | Japan . | |
| 9-23019 | 1/1997 | Japan . | |
| 9023019 | 1/1997 | Japan | H01L 31/042 |

*Primary Examiner*—Ellis Robinson
*Assistant Examiner*—Michael C. Miggins
*Attorney, Agent, or Firm*—Fitzpatrick, Cella, Harper & Scinto

[57] ABSTRACT

To reduce the capacity required for an external DC power source which supplies power for snow-melting and to prevent the problems associated with defective strings, the present invention comprises individually switchable current ON/OFF means provided for each string and a control unit for individually controlling the ON/OFF of said current ON/OFF means, thus enabling the sequential application of current to each single string.

10 Claims, 7 Drawing Sheets

PHOTOVOLTAIC POWER GENERATING SYSTEM

BACKGROUND OF THE INVENTION

1. Field of the Invention

The present invention relates to a photovoltaic power generating system, more specifically to a photovoltaic power generating system with a snow-melting function.

2. Related Background Art

In recent years, photovoltaic power generating systems for residences with solar cells mounted on a roof have become popular. In a snowy district, however, snow sticks to the surface of a solar panel, thereby disabling power generation while shown is present. Accordingly, a snow removal system which entails heating a solar panel module has been invented.

In Japanese Patent Application Laid-Open No. 8-250756, for example, a snow-melting system is disclosed which supplies electric power to a solar cell or an exothermic body for heating with the aid of an external power source.

In Japanese Patent Application Laid-Open No. 9-23019, a snow-melting system is disclosed which uses a bidirectional inverter to supply electric power to a solar cell for heating with a switch provided for the bypass of a reverse-current preventive diode.

Since the solar cell is utilized not only as a generating device but also as a heater, the cell-heating scheme is simply capable of snow removal without the need for further wiring for a heater; it further becomes easy to install if the bidirectional operativity is afforded. Thus, it is promising as a snow removal method for the photovoltaic power generating system.

In the schemes disclosed thus far, however, the following problems may occur.

<1> Since whole array must be warmed, the capacity of an external power source increases. Heating by the flow of the same current through a solar cell, e.g., of 3 kWp in the forward direction as the optimum current, requires a power on the order of about 4.2 kW, and a capacity sufficient to supply this power is necessary for the power source. Especially for a system with the directional use of a grid-connected inverter, the capacity of the inverter increases, and the inverter of large capacity is required for the supply of a power for snow-melting not used at ordinary times.

<2> When supplying power all at once to the whole array, there is a possibility of current concentration in a solar cell circuit due to a decrease in resistance by unbalanced heating of a solar cell. In this application, the solar cell basically works as parallel connected diodes and requires a countermeasure for unbalanced heat-up. The occurrence of current concentration might lead to a critical accident such as damage of solar cells due to overheating.

<3> For these reasons, it is not possible to run the snow-melting mode if even one defective string is present.

SUMMARY OF THE INVENTION

Considering these problems, it is one object of the present invention to implement a reduction of the capacity of an external DC power source for the supply of power for snow-melting in a photovoltaic power generating system, in particular a photovoltaic power generating system with a snow-melting function.

It is another object of the present invention to beforehand prevent an accident which occurs when a defective string exists.

It is a further object of the present invention to provide a photovoltaic power generating system with a solar cell array comprising a plurality of strings connected in parallel, wherein each string is comprised of a plurality of solar cell modules connected in series, capable of making the solar cell array generate heat with the aid of an external power source. The external power source comprises a current ON/OFF means individually switchable provided for each string; and a control unit for individually controlling the ON/OFF of the current switching means. A current is applied to each string in sequence such that heat is generated. Incidentally, in the present invention, the current to be applied to each string may be either reverse or equal in direction to that of the generating time (the applied voltage may be either equal or reverse in direction to the generated voltage).

Besides, in the present invention, overcurrent detecting means and alarming means are provided in the above external DC power source, so as to stop the application of current and issue an alarm upon the occurrence of overcurrent.

The present invention has a switch for each string and energizes only the target string for snow-melting by the ON/OFF control thereof. Accordingly, in a system according to the present invention, the whole array is not energized at once. Thus, only a small source capacity is required for the external DC power source, and further the provision of alarming means enables the presence of a wrong string to be alarmed individually if any string wrong in behavior is present. Besides, since strings are individually energized, energization can be executed to the exclusion of the wrong strings, thus enabling partial snow-melting running.

DETAILED DESCRIPTION OF THE PREFERRED EMBODIMENTS

Hereinafter, referring to the embodiments, the present invention will be specifically described.

Embodiment 1

In this embodiment, to make the present invention more clear, description will be made using as simple arrangements as possible.

Figure 1:
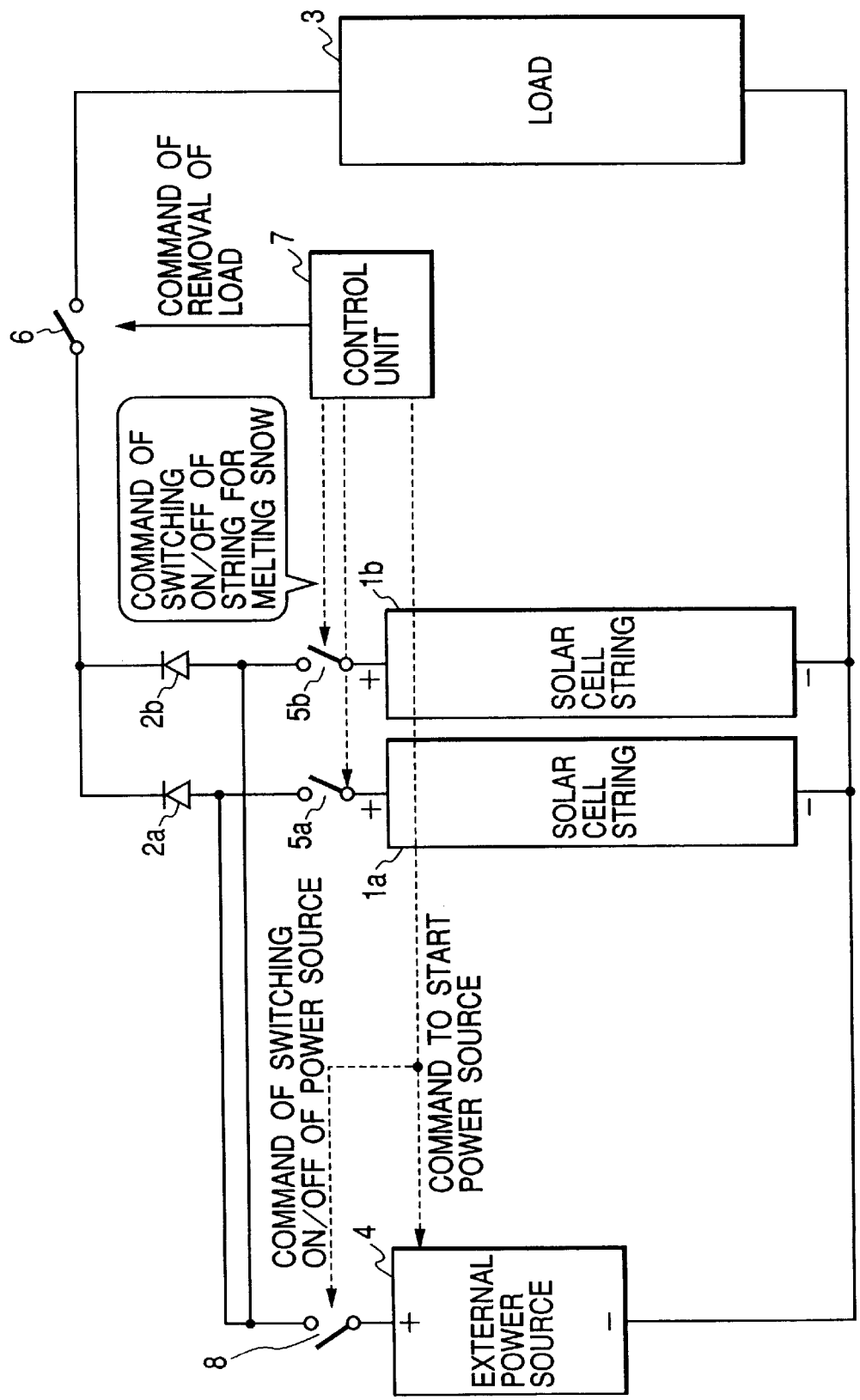
FIG. 1 is a block diagram of a photovoltaic power generating system according to one embodiment of the present invention.

A system according to this embodiment is shown in FIG. 1.

Four solar cell modules (thirty six 10 cm square cells in series; shunt current: 3.25 A; maximum power: 50 W) were used to construct solar cell strings 1a and 1b in 2 series and 2 parallel (namely, 2 modules are connected in series to a string circle).

The outputs of the above solar cell strings 1a and 1b are connected through the string switches 5a and 5b, reverse-current blocking diodes 2a and 2b and a load switch 6 to a resistance load 3 (5 Ω, 400 W grade).

As an external power source 4, a voltage variable DC power source (maximum output: 50 V 5 A) with a commercial AC (not shown) prepared, and its output is connected through the string switches 5a and 5b to the solar cell strings 1a and 1b, respectively.

At this time, the positive and negative terminals of the external power source 4 are connected to the anodes and cathodes of the solar cell strings 1a and 1b, respectively. If capable of supplying power to solar cell strings, any power source will do for the external power source 4, and a combination of an accumulator and a DC/DC converter or a dynamo may be employed.

Although those having the DC output are simple and desirable, those of AC are available according to the contrivance (adequate voltage setting). The voltage varying function is not especially essential. This is because specifying the configuration of a solar cell allows an appropriate applied voltage to be determined in advance.

The string switches 5a and 5b are required only to withstand the output voltages and currents of the solar cell strings 5a and 5b for a system without a heating function (e.g., snow-melting one). But such switches are required to withstand the voltage and current during the heating (snow-melting) mode (in many cases, greater than the operating voltage and current of solar cell strings) in a system according to the present invention. Furthermore, they are preferably ON/OFF controllable in response to an electric signal.

With this embodiment, to simplify the control program, the control unit 7 is composed of a personal computer and a parallel IO interface (the electric circuit of a PC and those to be controlled are insulated from each other by means of a photocoupler). If a sequential control is permitted, a great variety of arrangements other than this can be assumed for the control unit 7, and an arrangement comprising a single chip microcomputer is handy and inexpensive in practical use.

Figure 2:
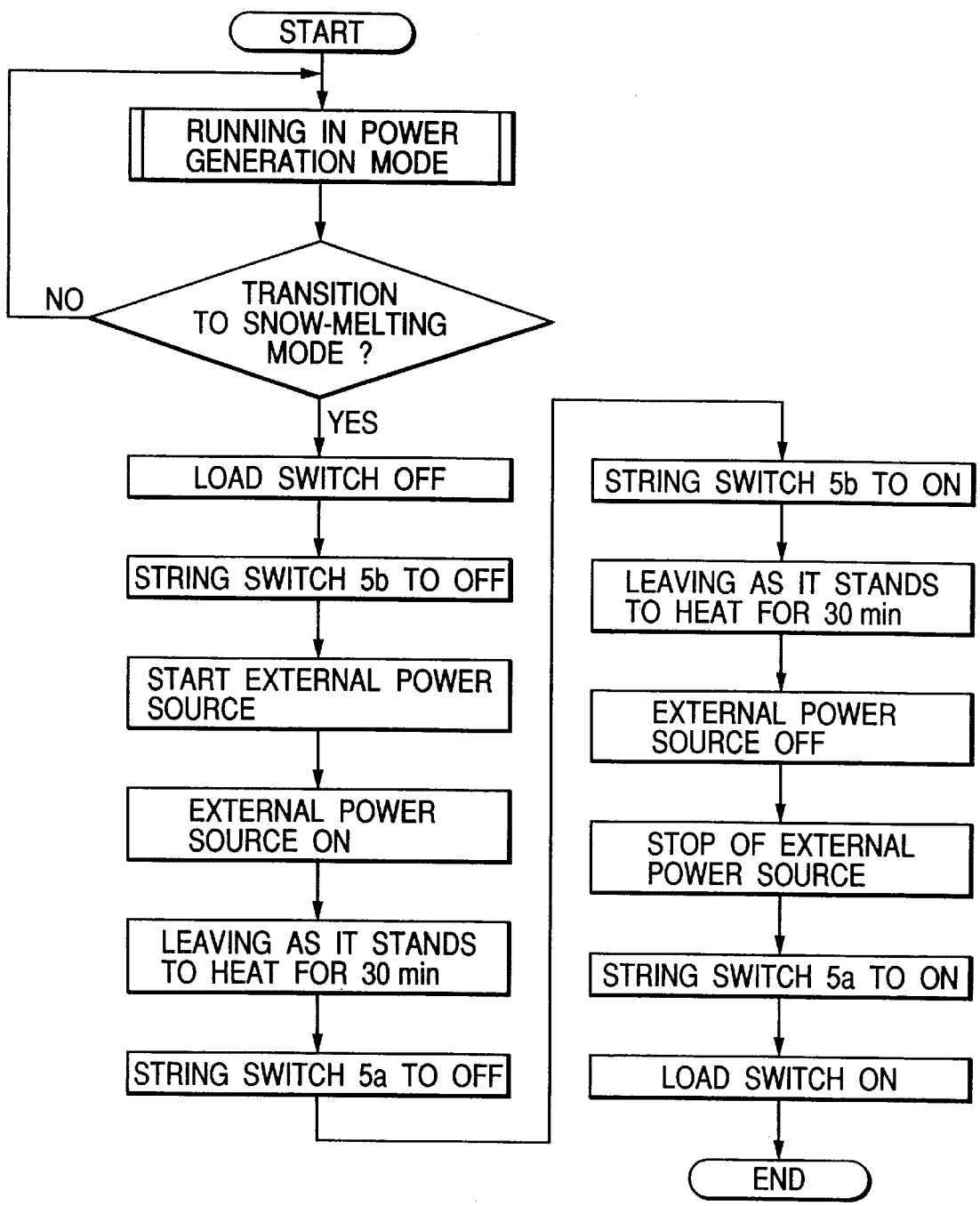
FIG. 2 is a flowchart showing one example of operation in the system of FIG. 1.

Next, the operation of the device of FIG. 1 will be described. One example of operation flow for the device of FIG. 1 is shown in FIG. 2.

At first, this device operates ordinarily in the power generation mode. This state is a state in which power is supplied from the solar cell strings 1a and 1b to the load 3, where the string switches 5a and 5b are both ON, the load switch 6 is also ON and the external power source switch 8 is OFF. For the external power source 4 itself, being in motion presents no problem, but being at rest is rather desirable from the viewpoint of power saving. In this embodiment, the external power source 4 is set to rest. This continues until the system enters the heating (snow-melting) mode.

Next, the heating (snow-melting) mode will be described. In many cases, the heating (snow-melting) mode is executed at night. Also in the daytime, running in the heating (snow-melting) mode is not impossible, but consideration of the power generating operation of a solar cell is required. Namely, during a period of snow, since a solar cell generates no power, the same handling is possible as that of night-time, but when snow comes gradually off and light begins to be incident on the solar cell, the solar cell begins to partially generate power, and consequently a contrivance for promoting the supply voltage from the external power source or the like becomes necessary.

In the heating (snow-melting) mode, the load switch 6 is first turned OFF, thereby breaking the connection to load 3.

Next, one string switch (here, 5b) is turned OFF by a string ON/OFF command signal from the control unit 7 so as to allow a current to flow only through a single string.

Next, the external power source 4 is set in motion, and the external power switch 8 is turned ON to apply a current to the solar cells for heating. Here, they are heated for 30 minutes. It is confirmed that the current and voltage at this time are 46 V and about 140 W and that the temperature rose by about 10° C. for 30 minutes.

Next, the string switch 5a which is ON is turned OFF, and another string switch (here, 5b) is turned ON, thereby heating another string as with the above string to carry out a snow-melting operation.

Finally, the external power source switch 8 is turned OFF to stop the supply from the external power source 4, the string switch 5a and load switch 6 are turned ON (5b remains ON) to return the system to the initial state and the running is terminated.

The capacity of the external power source prepared in this embodiment is 50 V 5 A, but it is evident that an external power source greater in capacity becomes necessary for simultaneous heating of both strings, thus resulting in increased device cost. It is also obviously understood that the cost difference increases with an increasing number of strings.

Incidentally, this embodiment is applicable to an optional device to a normal photovoltaic power generating system as well.

Besides, an ordinary commercial power source or accumulator may be used.

Embodiment 2

Figure 3:
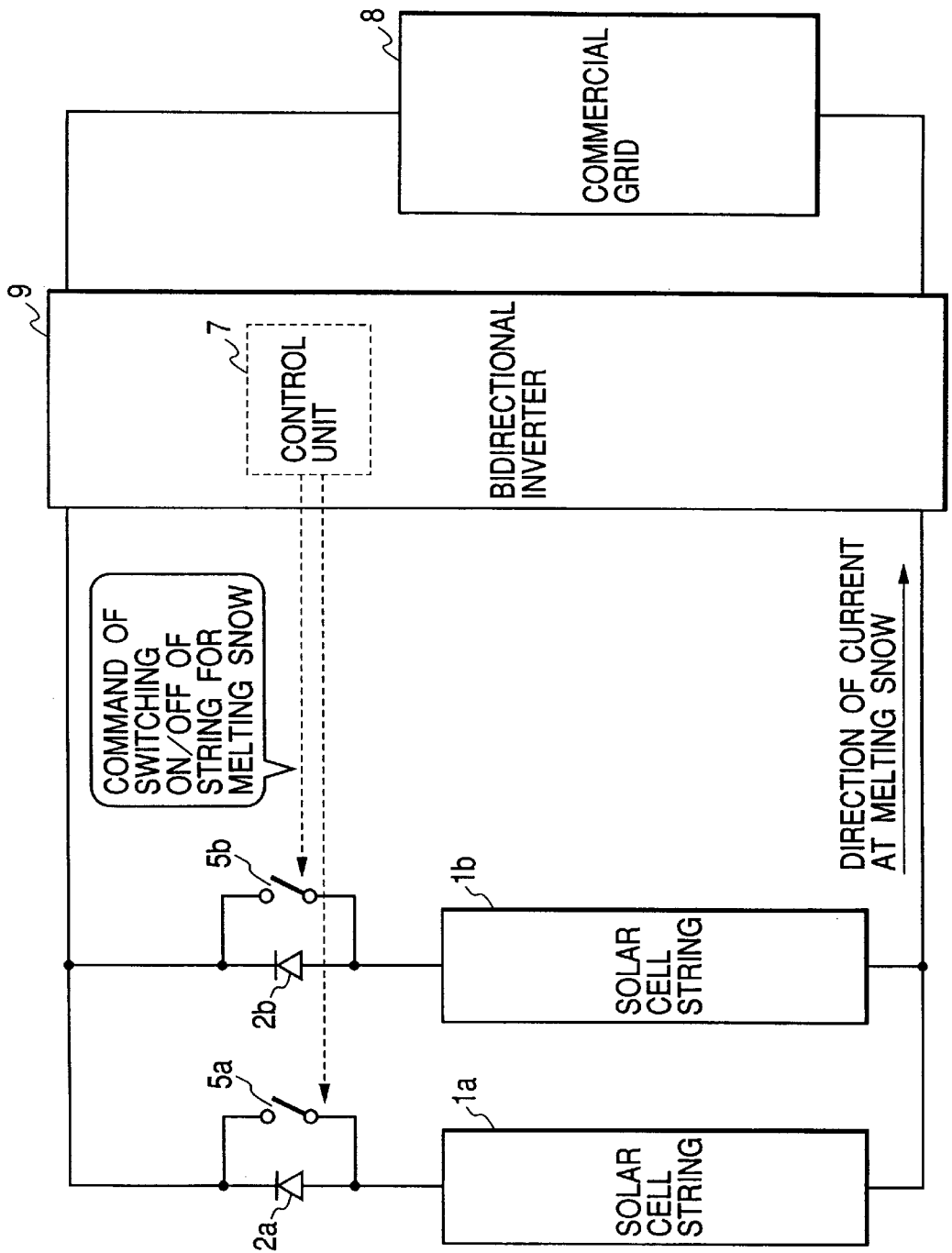
FIG. 3 is a block diagram of a photovoltaic power generating system according to another embodiment of the present invention.

In this embodiment, one embodiment of a one-body constructed amorphous module will be shown as a more practical configuration. FIG. 3 shows the configuration of this embodiment.

Solar cell strings 1a and 1b are constructed as a 10 series and 2 parallels connection of amorphous solar cell modules with a photoelectric converter layer comprising three layers made of amorphous silicon.

In contrast to a crystal type solar cell, the solar cell employed in this embodiment has a relatively low efficiency of power generation per area, and accordingly the covering ratio of the roof can be made greater than that obtained in a system using a crystal type solar cell of the same capacity. This is suitable for the purpose of "snow-melting". To be specific, as a large amount of snow on the surface of a roof is desired to be removed by snow-melting, the higher covering ratio of a roof is so much the better for that. On the other hand, since the price of a solar cell is the same per unit generated power output (so-called price per W), it is significant and inexpensive for the purpose of snow-melting to raise the covering ratio of a roof by use of a low efficiency solar cell.

Figure 4:
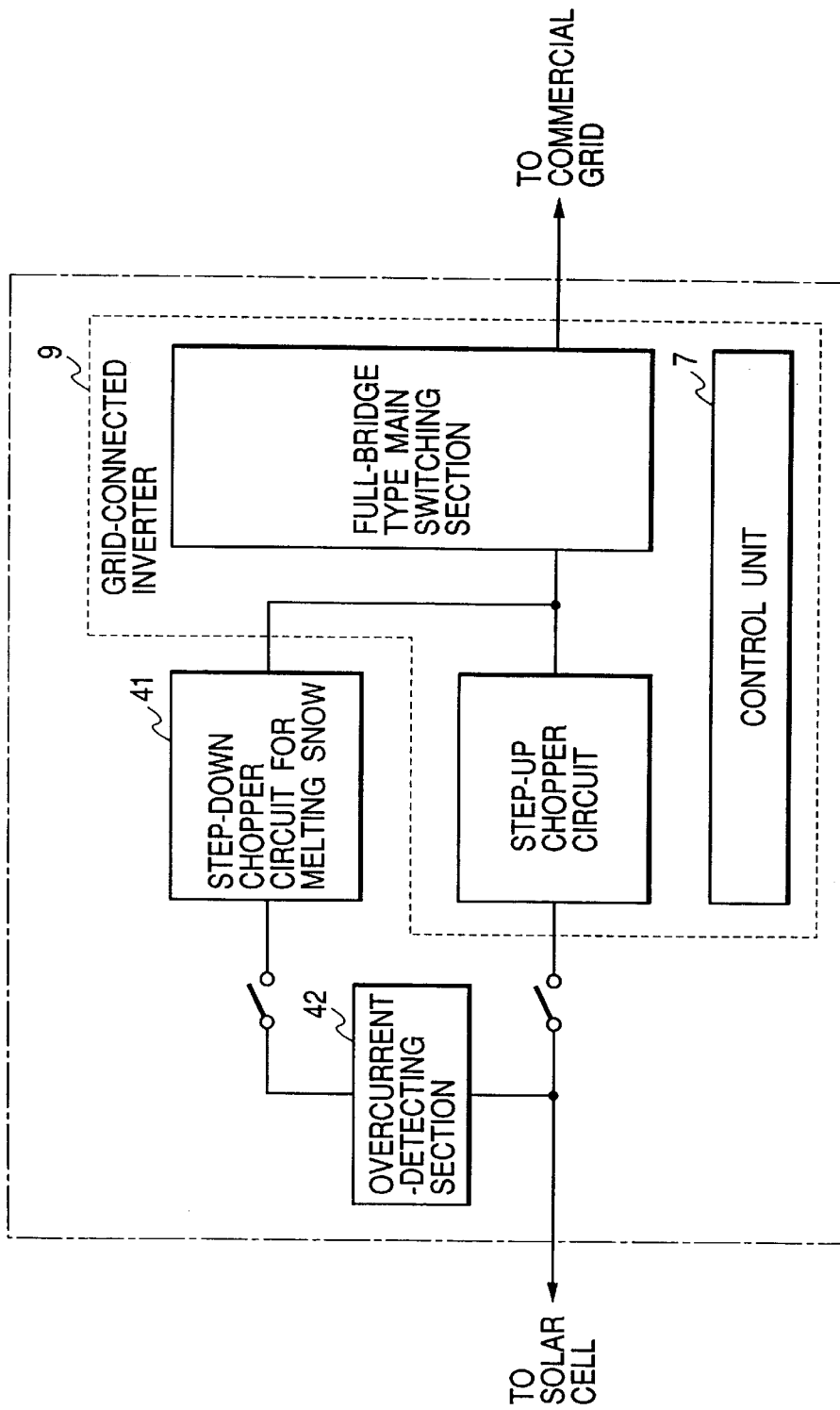
FIG. 4 is a block diagram of one configurational example of a bidirectional inverter used for the system of FIG. 3.

An inverter 9 is so arranged as is permissible for bidirectional conversion and is connected to a commercial grid of 200 V. One configurational example of such an inverter is shown in FIG. 4. In FIG. 4, the configuration of a grid-connected inverter 9 often used usually is illustrated by the enclosure with a broken line. Generally, an inverter used for snow-melting desirably comprises to comprise an output voltage control circuit for snow-melting with the step-up/-down function in order to flow the current from a commercial power source to a solar cell as shown in this example. In other words, part of the external power source 4 in Embodiment 1 is incorporated into the grid-connected inverter 9. Incidentally, because it is not essentially related to the present invention, the detailed configuration of a bidirectional grid-connected inverter will not be described in detail here. There are some well known techniques, and therefore reference should be made to these. In this embodiment, since the operating voltage of a solar cell is near 130 V, a direct connection of the rectified voltage 290 V from a 200 V commercial grid leads to overcurrent. Thus, a DC chopper circuit 41 with the step-down function is used as voltage control circuit for snow-melting. Depending upon the selection of a solar cell voltage, there is no need for the step-up/-down, but such cases are few.

Besides, as a matter of course, this embodiment must be equipped with means 7 for controlling string switches 5a and 5b. Since a one-chip microcomputer is built in the grid-connected inverter 9 as a control unit 7 in almost all cases, the present invention can be executed only by adding the movement of the snow-melting mode to its control software. Also in this embodiment, this method is employed. Incidentally, to control the string switches 5a and 5b, the terminal for outputting a control signal is also required.

In this embodiment, the string switches 5a and 5b are so connected as to bypass the reverse-current blocking diodes 2a and 2b. Otherwise a current cannot flow to the solar cell strings 1a and 1b in the presence of the reverse-current blocking diodes 2a and 2b, and consequently the string switches 5a and 5b must be provided at a position enabling the bypass of the reverse-current blocking diodes 2a and 2b without fail.

In this embodiment, only one overcurrent detecting section 42 is installed at the position shown in FIG. 4, i.e., between the step-down chopper circuit for heating (snow-melting) and the solar cell. When a current flows only through a single string as in the present invention, such a provision of only one overcurrent detection means enables the overcurrent to be detected. When current is supplied through strings all at once, an absolute detection of overcurrent can be made unless current is not detected for each string. Especially when unbalanced heat-up of a solar cell occurs, the stability of a system may be damaged.

Figure 5:
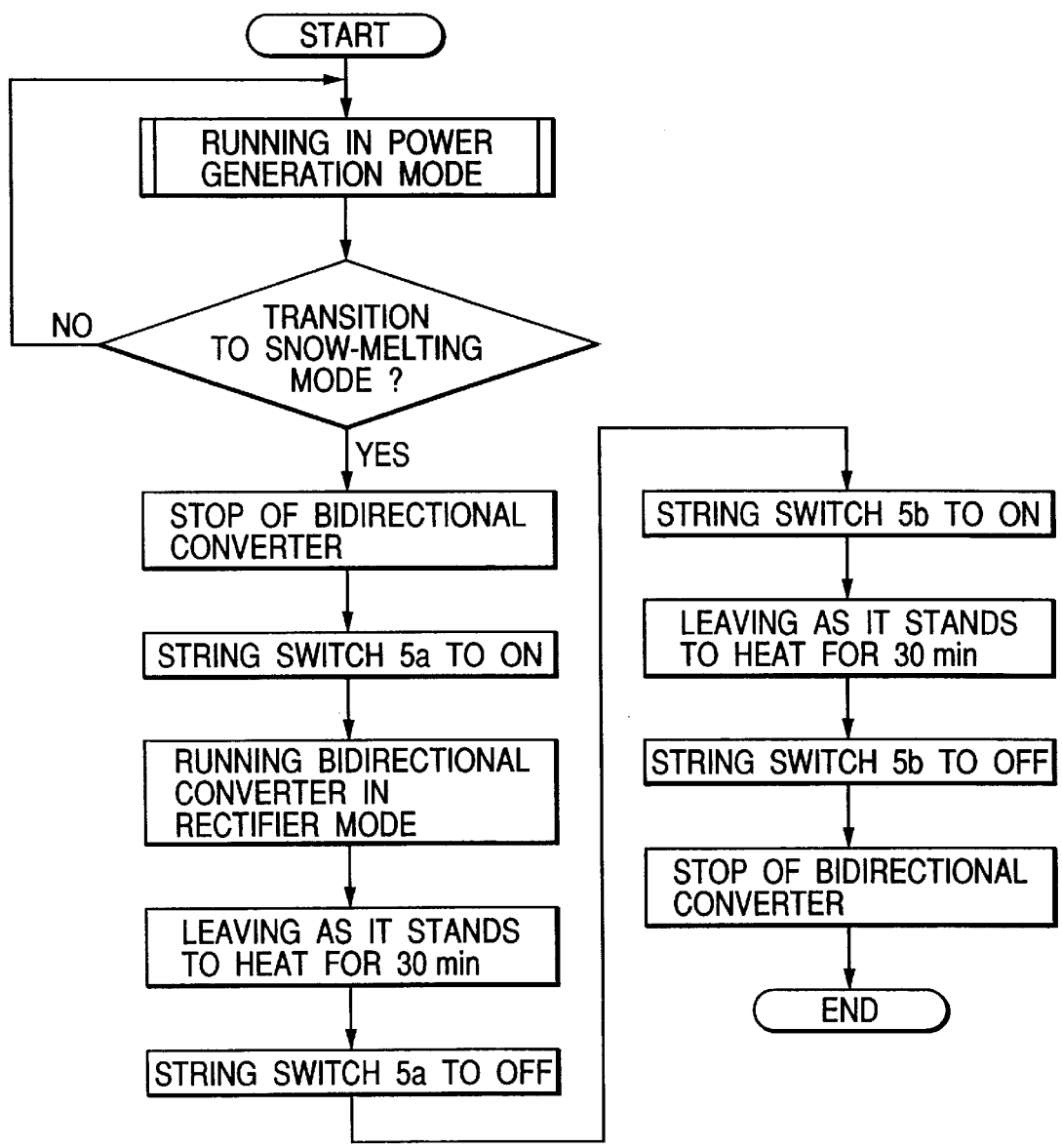
FIG. 5 is a flowchart showing one example of operation in the system of FIG. 3.

In FIG. 5, the operation flow of this embodiment is shown. Even if the type of solar cell and the constitution of a power source for snow-melting is modified, the intention of the present invention can be attained perfectly. Incidentally, in the operation flow of FIG. 5, both of the string switches 5a and 5b are OFF during the generation mode, and the bidirectional inverter 9 runs in the rectifier mode during the snow-melting mode.

Furthermore, if the control unit 7 is so arranged as to be able to store a wrong string (string through which overcurrent flowed), snow-melting can be carried on to the exclusion of the wrong string(s), and accordingly the effect of snow-melting can be promoted to a fixed extent though not over the whole roof.

Besides, by initiating the sequence of snow-melting with the string positioned, for example, on the top of the roof, the water generated by the melting snow can increase the effect of snow-melting in the lower portion of snow.

Embodiment 3

Figure 6:
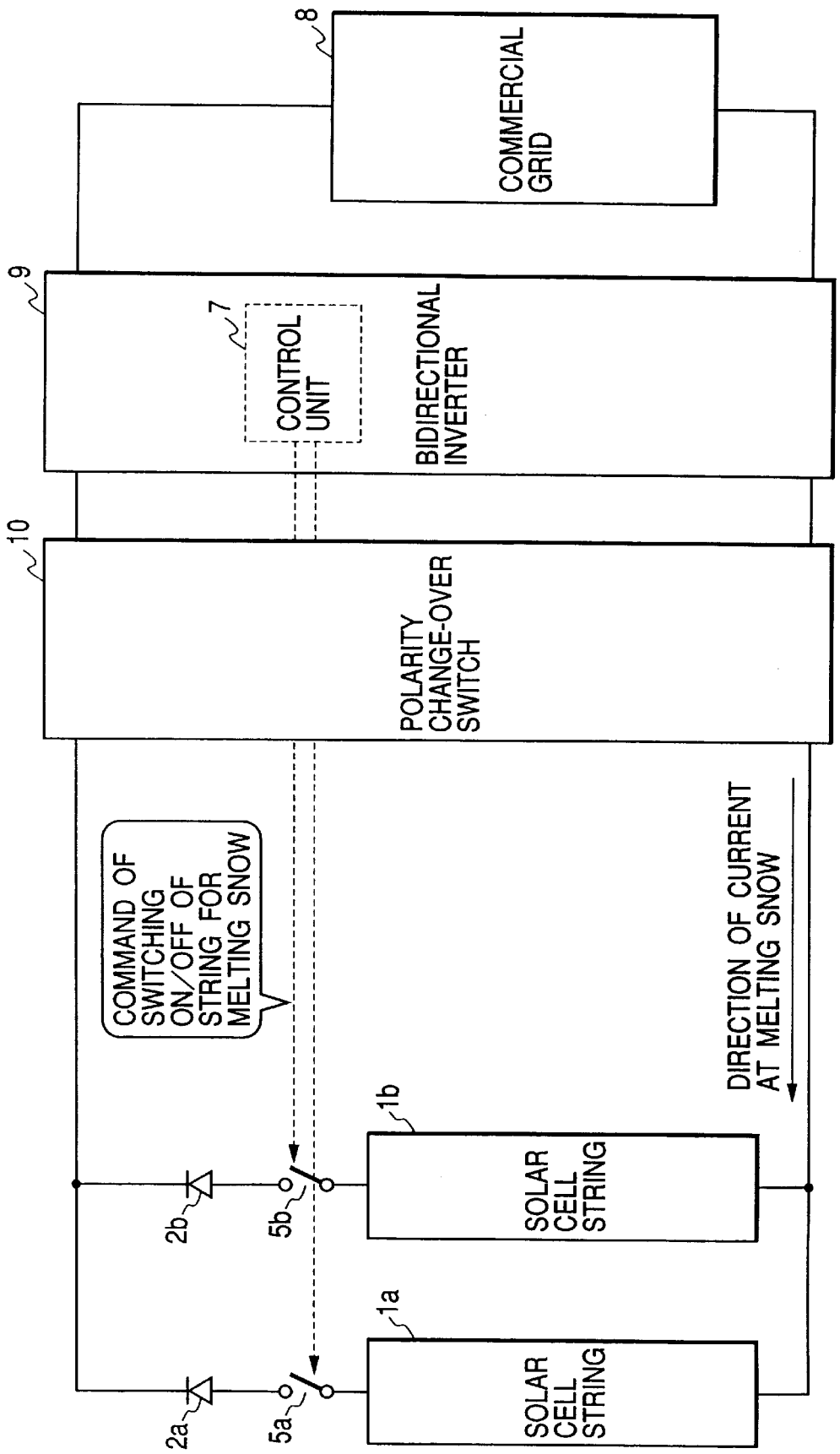
FIG. 6 is a block diagram of a photovoltaic power generating system according to a third embodiment of the present invention.

FIG. 6 shows one embodiment of a reverse-current type.

In this embodiment, because they are energized also during heating (snow-melting), the reverse-current blocking diodes 2a and 2b must withstand the flow of current during snow-melting.

Besides, since the mounting of a bypass diode (not shown) disables cell heating, it must be noticed that no bypass diode is usable. A module suitable for use in such an arrangement is proposed, for example, in Japanese Patent Application Laid-Open No. 8-250756. The relevant module is intentionally made poor in reverse characteristics so that no current flows. In a solar cell module without a bypass diode, an implementation as seen in this embodiment is in principle possible though such an arrangement is taken. However, the applied voltage per module becomes very high (the value of current can be reduced in return for this) and care must be fully taken to preserve safety in practical use.

Meanwhile, in this embodiment, the solar cell strings 1a and 1b are made equal to those used in Embodiment 1, an inverter 9 similar to that of Embodiment 2 is used and further a polarity change-over switch 10 is so provided as to enable voltage to be supplied opposite the direction of a period of power generation. Instead, the string switches 5a and 5b employed for the bypass of reverse-current blocking diodes 2a and 2b as with Embodiment 2 not required. It is required, however, to control the ON/OFF of ordinary string switches 5a and 5b as with Embodiment 1.

Figure 7:
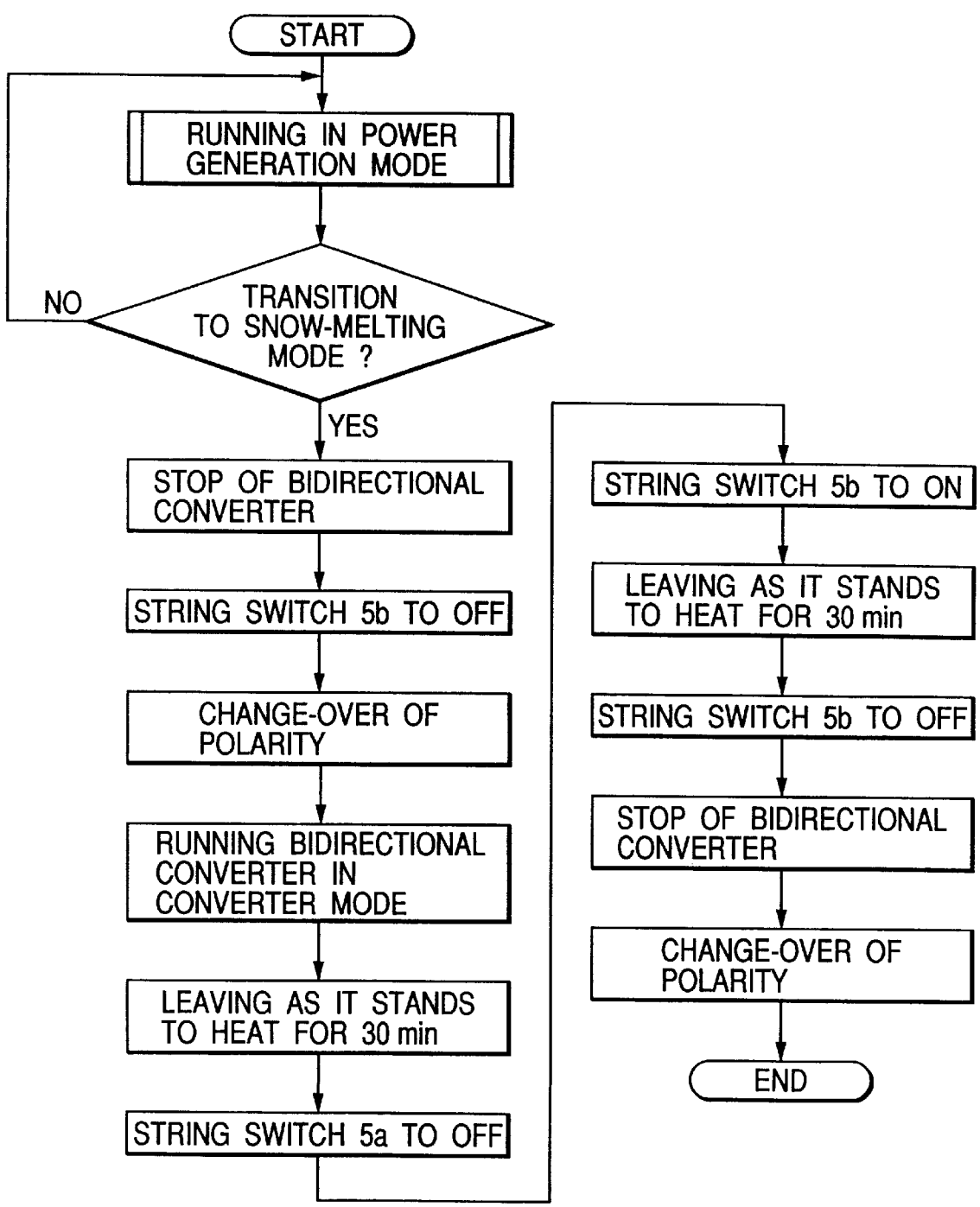
FIG. 7 is a flowchart showing one example of operation in the system of FIG. 6.

FIG. 7 shows the flow of operation in this embodiment. Also in this embodiment, executing a snow-melting operation for each single string is evidently possible. Incidentally, in the operation flow of FIG. 7, both of the string switches 5a and 5b are ON during the generation mode, and the bidirectional inverter 9 runs in the converter mode during the snow-melting mode.

Incidentally, the voltage applied to a string should amount to 360 V (5V per cell) to generate the same heating as with Embodiment 1 in this embodiment. Even to an arrangement that current is made to flow in the same direction as that for a period of power generation like this embodiment, the present invention is applicable.

As described above, the present invention is appropriately applicable to a photovoltaic power generating system having a solar cell array of parallel connected strings formed of solar cell modules connected in series with the snow-melting function, for example, on the surface of solar cell modules by applying current to the solar cell array from an external DC power source for heating. Especially, the present invention, comprising individually switchable current ON/OFF means provided for each string and a control unit for individually controlling the ON/OFF of the current ON/OFF means, can apply a current to each single string in sequence for heating (snow-melting) and therefore has the following advantages:

(1) In a system according to the present invention, the array is not energized all at once. For this reason, only a small capacity is required of the power source for heating (snow-melting).

(2) Since sequential application of current to each single string enables something wrong to be detected in the unit of a string, strings wrong in behavior can be individually detected if present.

(3) Since each individual string is energized in sequence, energization can be executed to the exclusion of the wrong strings and partial heating (snow-melting) is possible.

(4) Heating (snow-melting) for each single string eliminates a fear of current concentration due to the unbalanced heat-up of a solar cell.

(5) Employing a low efficiency amorphous, one-body constructed module enables the covering ratio of a roof with solar cells to be raised and the snow removal area to be increased.

The present invention having such advantages is extremely high in industrial utility value.

What is claimed is:

1. A photovoltaic power generating system with a solar cell array which comprises a plurality of solar cell strings connected in parallel, each string comprising a plurality of solar cell modules connected in series, capable of making the solar cell array generate heat with the aid of an external power source, comprising:

a switchable current ON/OFF means provided for each solar cell string; and a control unit for individually controlling the switchable current ON/OFF means, wherein a current is applied to each solar cell string in sequence such that heat is generated.

2. The photovoltaic power generating system according to claim 1, wherein said external power sources supplies a DC current in reverse direction to that of a generating time to each string.

3. The photovoltaic power generating system according to claim 2, wherein said external power source is a bidirectional grid-connected inverter capable of converting a DC output of said solar cell array into an AC output to link said solar cell array in running with an AC power source and of converting an AC output of the AC power source into a DC output to supply said DC output to the side of said solar cell array.

4. The photovoltaic power generating system according to claim 3, wherein said switchable current ON/OFF means is connected in parallel to reverse-current blocking diodes respectively connected in series to said solar cell strings.

5. The photovoltaic power generating system according to claim 1, wherein said external power source supplies a DC current equal in direction to that at a time of generating electrical energy to each solar cell string.

6. The photovoltaic power generating system according to claim 5, wherein said external power source is a bidirectional grid-connected inverter capable of converting the DC output of said solar cell array into an AC output to link said solar cell array in running with an AC power source and of converting an AC output of the AC power source into a DC output to supply said DC output to the side of said solar cell array and wherein said external power source has a means for reversing the polarity of the DC output of said bidirectional grid-connected inverter in order to supply a DC current in a forward direction to each solar cell string.

7. The photovoltaic power generating system according to claim 1, wherein said solar cell module has a stacked cell with two or three photovoltaic conversion layers.

8. The photovoltaic power generating system according to claim 1, wherein said external power source has an overcurrent detecting means and an alarming means, and an application of current is stopped and an alarm is given when an overcurrent is generated.

9. The photovoltaic power generating system according to claim 1, wherein said switchable current ON/OFF means is turned ON/OFF from the first of the solar cell strings in order.

10. The photovoltaic power generating system according to claim 1, wherein each of said solar cell strings is connected to said external power source through said switchable current ON/OFF means.

* * * * *

UNITED STATES PATENT AND TRADEMARK OFFICE
CERTIFICATE OF CORRECTION

PATENT NO. : 6,093,885
DATED : July 25, 2000
INVENTOR(S) : Nobuyoshi Takehara et al.

It is certified that error appears in the above-identified patent and that said Letters Patent is hereby corrected as shown below:

Title page,
Item [56], References Cited, FOREIGN PATENT DOCUMENTS,
"9-23019  1/1997   Japan" should be deleted; and
"9023019" should read -- 9-23019 --.

Column 1,
Line 14, "shown" should read -- snow --; and
Line 36, "Since" should read -- Since the --.

Column 2,
Line 9, "string;" should read -- string, --.

Column 3,
Line 10, "(not shown)" should read -- (not shown) was --; and
Line 29, "snow-melting one)." should read -- snow-melting). --

Column 4,
Line 43, "parallels connection" should read -- parallel connection --; and
Line 67, "to comprise" should be deleted.

Column 6,
Line 20, "2" should read -- 2 are --.

Signed and Sealed this

Tenth Day of May, 2005

JON W. DUDAS
*Director of the United States Patent and Trademark Office*